US009385732B2

(12) United States Patent
Kim et al.

(10) Patent No.: US 9,385,732 B2
(45) Date of Patent: Jul. 5, 2016

(54) SYNTHESIZING METHOD OF SIGNAL HAVING VARIABLE FREQUENCY AND SYNTHESIZER OF SIGNAL HAVING VARIABLE FREQUENCY

(71) Applicant: SNU R&DB FOUNDATION, Seoul (KR)

(72) Inventors: Jae Ha Kim, Seoul (KR); Hwan Seok Yeo, Seoul (KR); Si Gang Ryu, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 5 days.

(21) Appl. No.: 14/604,533

(22) Filed: Jan. 23, 2015

(65) Prior Publication Data
US 2015/0214960 A1    Jul. 30, 2015

(30) Foreign Application Priority Data

Jan. 24, 2014    (KR) ........................ 10-2014-0009207

(51) Int. Cl.
*H03L 7/06* (2006.01)
*H03L 7/18* (2006.01)
*H03L 7/081* (2006.01)
*H03K 4/02* (2006.01)

(52) U.S. Cl.
CPC .......... *H03L 7/18* (2013.01); *H03L 7/081* (2013.01); *H03K 4/026* (2013.01); *H03L 2207/50* (2013.01)

(58) Field of Classification Search
None
See application file for complete search history.

(56) References Cited

U.S. PATENT DOCUMENTS

| | | | | |
|---|---|---|---|---|
| 2007/0188244 A1* | 8/2007 | Waheed | .................. | H03L 7/099 331/16 |
| 2012/0200328 A1* | 8/2012 | Yao | .......................... | H03L 7/06 327/157 |
| 2013/0257494 A1* | 10/2013 | Nikaeen | ................ | H03M 3/458 327/156 |

FOREIGN PATENT DOCUMENTS

JP    2012-49660 A    3/2012
KR    10-2006-0027163 A    3/2006

\* cited by examiner

*Primary Examiner* — Cassandra Cox
(74) *Attorney, Agent, or Firm* — Paratus Law Group, PLLC

(57) ABSTRACT

A variable frequency signal synthesizer includes a phase locked loop including a time-to-digital converter configured to detect differences in phase and frequency between a reference signal and a feedback clock signal and output error signals corresponding to the detected differences, a digital loop filter, a digitally controlled oscillator, and a first frequency divider configured to divide output signals of the digitally controlled oscillator at a predetermined frequency division ratio, a feedback clock generation unit configured to generate sign signals and a phase-modulated feedback clock signal, and a frequency slope tracker configured to generate a frequency control signal by accumulating differences in the error signals according to signs corresponding to the sign signals. The digitally controlled oscillator receives the frequency control signal to supply an output variable frequency signal.

23 Claims, 12 Drawing Sheets

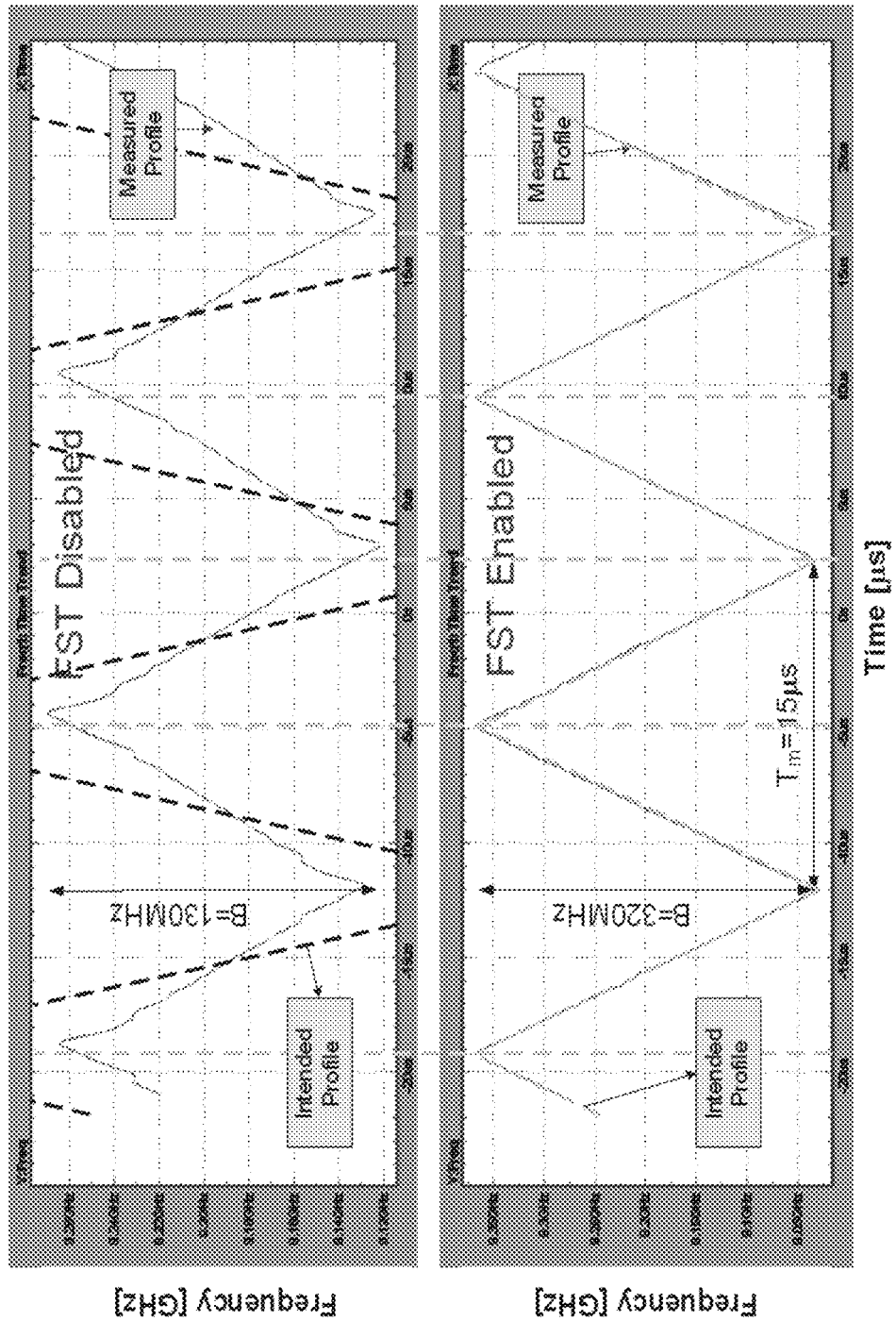

SYNTHESIZING METHOD OF SIGNAL HAVING VARIABLE FREQUENCY AND SYNTHESIZER OF SIGNAL HAVING VARIABLE FREQUENCY

CROSS-REFERENCE TO RELATED APPLICATION

This application claims priority to and the benefit of Korean Patent Application No. 10-2014-0009207, filed on Jan. 24, 2014, the disclosure of which is incorporated herein by reference in its entirety.

BACKGROUND

1. Field of the Invention

The present invention relates to a method of synthesizing a variable frequency signal, and a synthesizer for a variable frequency signal using the method.

2. Discussion of Related Art

In general methods of synthesizing variable frequency signals and general variable frequency signal synthesizers, there are a one-point modulation scheme in which a modulated signal is supplied to a delta sigma modulator included in a phase locked loop (PLL) to change a frequency division ratio, and a two-point modulation scheme in which a modulated signal is supplied to a voltage controlled crystal oscillator (VCXO) or a voltage controlled oscillator (VCO) as well as the delta sigma modulator included in a phase locked loop (PLL).

A variable frequency signal synthesizer uses a phase locked loop, and the phase locked loop has a low pass characteristic itself. Accordingly, in the one-point modulation scheme in which a frequency division ratio is changed in the phase locked loop to obtain a variable frequency signal, the modulation bandwidth of the frequency signal synthesized through the scheme is restricted within the bandwidth of the phase locked loop. The two-point modulation scheme is designed to achieve a wider modulation bandwidth than the one-point modulation scheme, by supplying modulated signals to the VCXO or VCO complementary to the phase locked loop so as to have a high pass characteristic. However, in the two-point modulation scheme, a mismatch between the two modulation gains may occur, and a timing mismatch may occur. In the conventional two-point modulation scheme, a calibration circuit may be necessary to compensate the gain mismatch and the timing mismatch. In addition, even when the calibration circuit is included, it is difficult to fully compensate the gain mismatch and the timing mismatch. In addition, due to the calibration circuit, a variable frequency signal synthesizer may have a complicated structure and a large die size, and power consumption thereof may be large.

Furthermore, in variable frequency signals synthesized using a conventional method, the feasible modulation depth is just several thousand parts per million (ppm) of the center frequency, or the modulation period is relatively long, for example, several milliseconds.

SUMMARY OF THE INVENTION

The present invention is directed to a method and a synthesizer for synthesizing a signal in which frequencies rapidly change in a wide bandwidth.

The present invention is directed to a variable frequency synthesizer, which prevents a gain mismatch and a timing mismatch and has low power consumption and small die size.

According to an aspect of the present invention, there is provided a variable frequency signal synthesizer including a phase locked loop having a time-to-digital converter configured to detect differences in phase and frequency between a reference signal and a feedback clock signal and output error signals corresponding to the detected differences, a digital loop filter, a digitally controlled oscillator, and a first frequency divider configured to divide output signals of the digitally controlled oscillator at a predetermined frequency division ratio, a feedback clock generation unit configured to generate sign signals and a phase-modulated feedback clock signal, and a frequency slope tracker configured to generate a frequency control signal by accumulating differences in the error signals according to signs corresponding to the sign signals. The digitally controlled oscillator receives the frequency control signal to supply an output variable frequency signal.

According to an aspect of the present invention, there is provided a method of synthesizing a variable frequency signal including (a) outputting sign signals and one clock signal having a target phase among a plurality of clock signals having different phases as a feedback clock signal by performing phase modulation, (b) outputting error signals corresponding to differences in frequency and phase between the feedback clock signal and a reference signal, (c) generating a frequency control signal by accumulating the differences in error signals according to signs corresponding to the sign signals, and (d) outputting a variable frequency signal by supplying the frequency control signal to the digitally controlled oscillator.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which:

FIG. 11 illustrates time versus frequency characteristics comparing the case in that a frequency slope tracker operates with the case in that a frequency slope tracker does not operate, under a condition in which a cycle of modulation is 15 μsec.

DETAILED DESCRIPTION OF EXAMPLES

Figure 1:
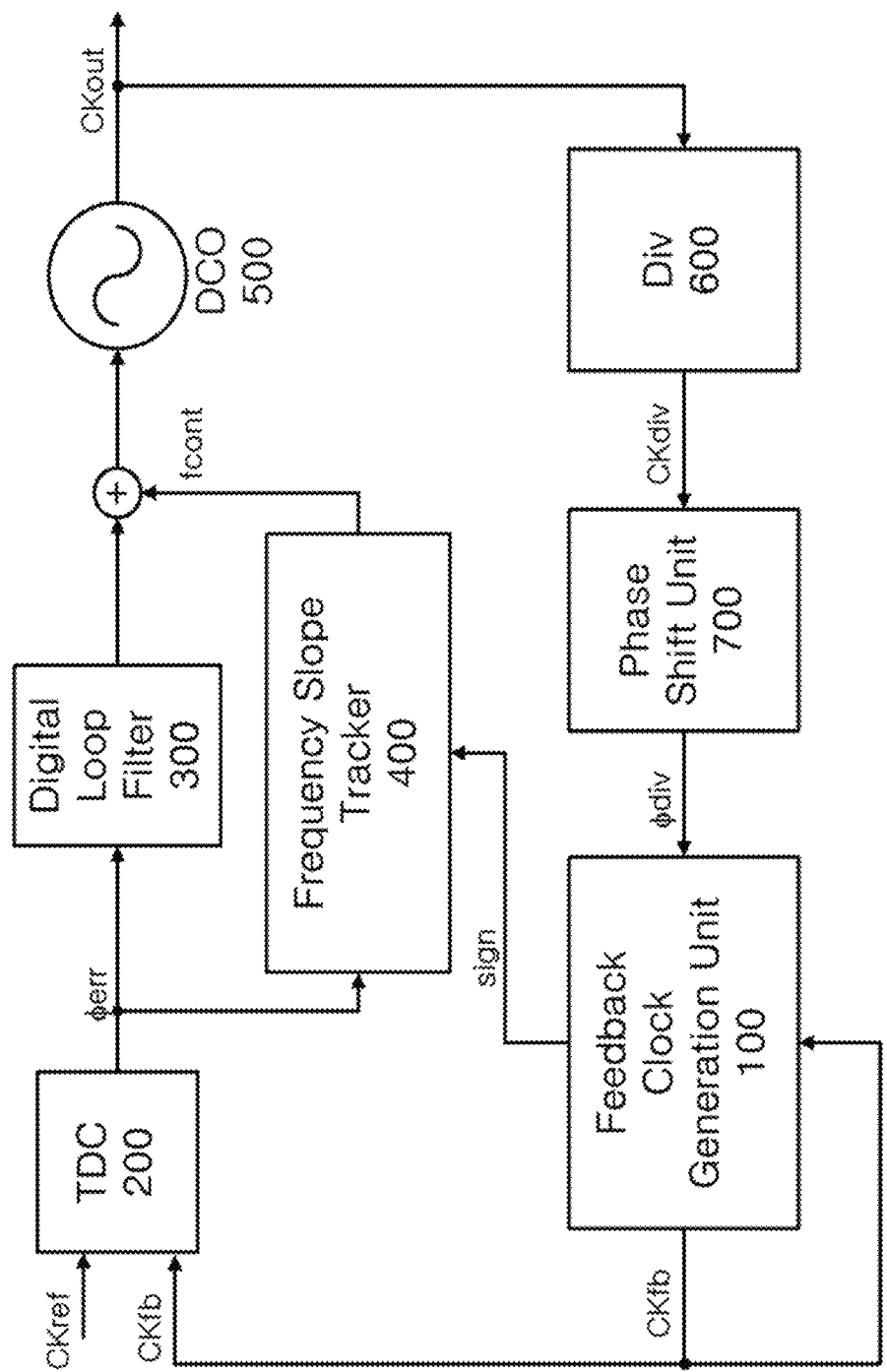
FIG. 1 is a block diagram illustrating an overview of a variable frequency signal synthesizer according to an embodiment of the inventive concept.

Since descriptions of the present invention are just embodiments for structural or functional description, the scope of the present invention should not be interpreted to be limited to the exemplary embodiments disclosed below, but can be implemented in various forms.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Operations may be contextually performed in a different sequence from a described sequence unless the context clearly indicates a particular sequence. That is, operations may be performed in the same sequence as the described sequence, may be substantially simultaneously performed, or may be performed in an opposite sequence.

In the drawings referred to, so as to describe the embodiments of the disclosure, the sizes, heights, and thicknesses of elements are intentionally exaggerated for convenience of explanation and easy understanding and are not enlarged or reduced according to magnification. Also, an element in the drawings may be intentionally reduced, and another element in the drawings may be intentionally enlarged.

All terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a variable frequency signal synthesizer and a method of synthesizing the variable frequency signal will be described with reference to the accompanying drawings. Although the embodiment of the present invention implemented in a digital circuit is described hereinafter, the present invention can be embodied in any one of an analog circuit and a digital circuit. In addition, the present invention can be embodied in an analog-digital mixed signal circuit. Further, the type of a line signal is not distinguished in the specification, and each signal line may be interpreted as a bus signal composed of a single signal or one or more analog or digital signals.

Figure 2:
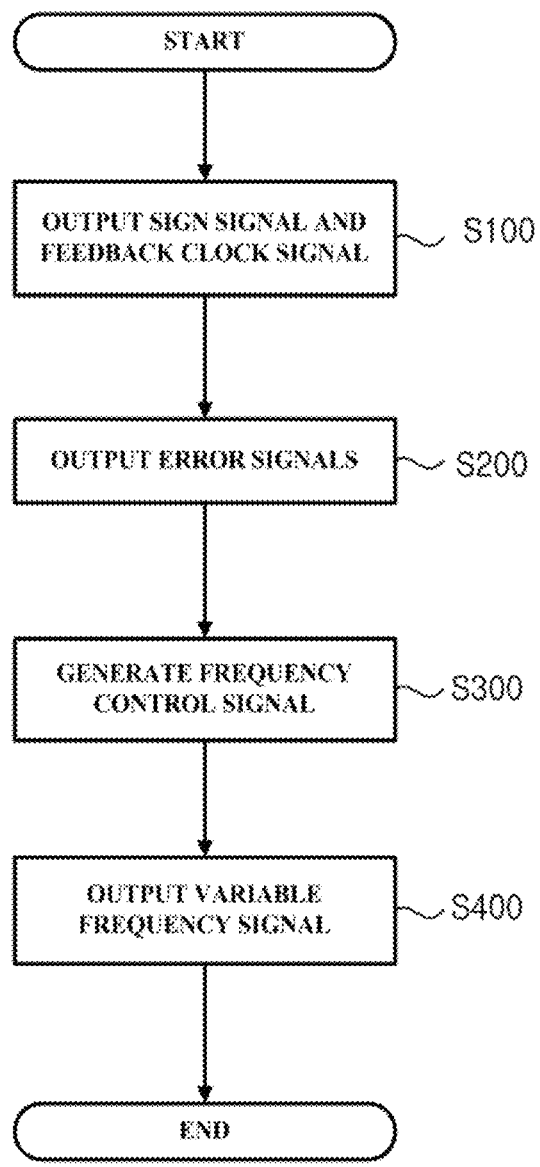
FIG. 2 is a flowchart of an overview of a method of synthesizing a variable frequency signal according to an embodiment of the present invention.

FIG. 1 is a block diagram illustrating an overview of a variable frequency signal synthesizer according to an embodiment of the present invention, and FIG. 2 is a diagram in the form of a flowchart illustrating an overview of a method of synthesizing a variable frequency signal according to an embodiment of the present invention. Referring to FIGS. 1 and 2, a variable frequency signal synthesizer according to an embodiment of the present invention includes a phase locked loop (PLL) including a time-to-digital converter (TDC) 200 configured to detect differences in phase and frequency between a reference clock signal CKref and a feedback clock signal CKfb and output error signals ϕerr corresponding to the detected differences, a digital loop filter 300, a digitally controlled oscillator (DCO) 500, and a first frequency divider (Div) 600 configured to divide an output signal CKout of the DCO 500 at a predetermined frequency division ratio, a feedback clock generation unit 100 configured to generate sign signals (sign) and a phase-modulated feedback clock signal CKfb, and a frequency slope tracker 400 configured to generate a frequency control signal fcont by accumulating differences in the error signals ϕerr according to the signs corresponding to the sign signals (sign). The DCO 500 receives the frequency control signal fcont to produce a variable frequency signal as an output.

The method of synthesizing a variable frequency signal according to an embodiment of the present invention may include outputting sign signals (sign) and one clock signal having a target phase among a plurality of clock signals having different phases as a feedback clock signal CKfb by performing phase modulation (S100), outputting error signals ϕerr corresponding to differences in frequency and phase between the feedback clock signal CKfb and a reference clock signal (S200), generating a frequency control signal fcont by accumulating the differences in error signals ϕerr according to signs corresponding to the sign signals (sign) (S300), and outputting a variable frequency signal by supplying the frequency control signal fcont to the DCO 500 (S400).

The reference clock signal CKref may be supplied by an oscillator (not shown) or by another PLL (not shown). The oscillator or PLL which provides the reference clock signal CKref may be located in the same circuit as the variable frequency signal synthesizer according to the embodiment of the present invention. In some embodiments, the oscillator or the PLL which provides the reference clock signal CKref may be located in a different circuit from the variable frequency signal synthesizer according to the embodiment of the present invention. In other embodiments, the oscillator or PLL which provides the reference clock signal CKref may be located in a different chip from the variable frequency signal synthesizer according to the embodiment of the present invention, and thus supplies only the reference clock signal CKref to the variable frequency signal synthesizer according to the embodiment of the present invention.

The DCO 500 may be controlled by signals supplied by the digital loop filter 300 and the frequency slope tracker 400 to output the output signal CKout having a frequency and phase corresponding to the control signal fcont. As will be described below, the output signal CKout is a signal whose frequency varies in a constant cycle within a predetermined bandwidth, and it is applied to the first frequency divider (Div) 600 included in the PLL. When implemented in an analog circuit, the DCO 500 may be implemented as a voltage controlled oscillator controlled by a voltage.

The first frequency divider (Div) 600 may receive the output signal CKout output from the DCO 500 to output a signal CKdiv divided at the predetermined frequency division ratio. A frequency divider included in a general PLL controls the phase and frequency of the output signal CKout by controlling the frequency division ratio. However, in the variable frequency signal synthesizer and the method of synthesizing a variable frequency signal according to the embodiment of the present invention, a variable frequency signal may be synthesized while the frequency division ratio of the first frequency divider (Div) 600 is maintained constant.

Figure 3A:
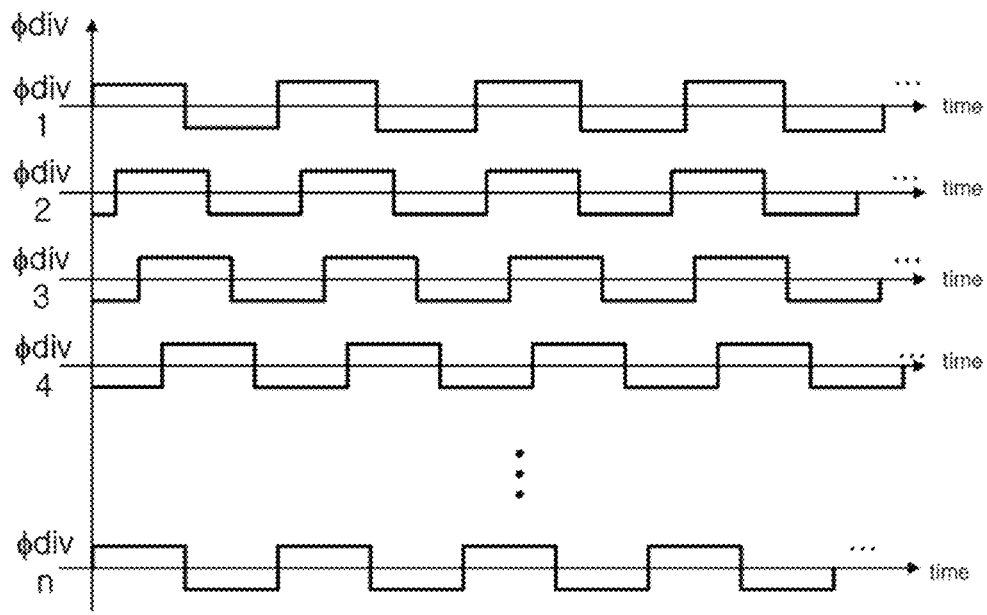
FIGS. 3A and 3B are diagrams exemplarily illustrating a plurality of signals having different phases, which are supplied by shifting phases of signals supplied by a first frequency divider by the phase shift unit.
Figure 3B:
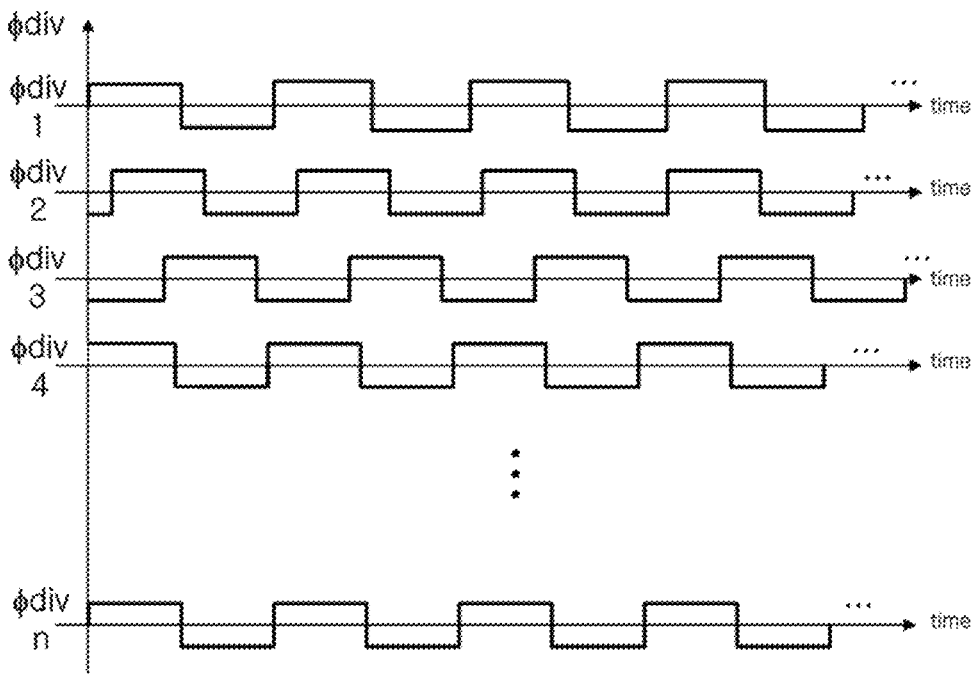

A phase shift unit 700 may receive the signal CKdiv divided by the first frequency divider (Div) 600 and shift a phase thereof to supply a plurality of signals φdiv having different phases. FIGS. 3A and 3B are diagrams exemplarily illustrating a plurality of signals φdiv with different phases, supplied by the phase shift unit 700 which shifts a phase of the signal CKdiv supplied by the first frequency divider (Div) 600. Referring to FIGS. 3A and 3B, the phase shift unit 700 receives the signal CKdiv divided by the first frequency divider (Div) 600, shifts its phase to have a predetermined phase, and supplies the plurality of signals φdiv with different phases. The phases of the signals φdiv output by the phase shift unit 700 may be determined by a linear function or a nonlinear function. In some embodiments, as illustrated in FIG. 3A, the phase of the signals φdiv supplied by the phase shift unit 700 may be determined according to a value obtained by a predetermined linear function, and phase differences between signals may be constant. In other embodiments, as illustrated in FIG. 3B, the phase of the signals φdiv supplied by the phase shift unit 700 may be determined according to a value obtained by a predetermined nonlinear function, and phase differences between signals may be different.

FIG. 1 illustrates an embodiment in which the phase shift unit 700 is located between the first frequency divider (Div) 600 and the feedback clock generation unit 100. However, in other embodiments (not shown), the phase shift unit 700 may be disposed to be included in the first frequency divider (Div) 600, and in other embodiments, the phase shift unit 700 may be included in the feedback clock generation unit 100.

Figure 4:
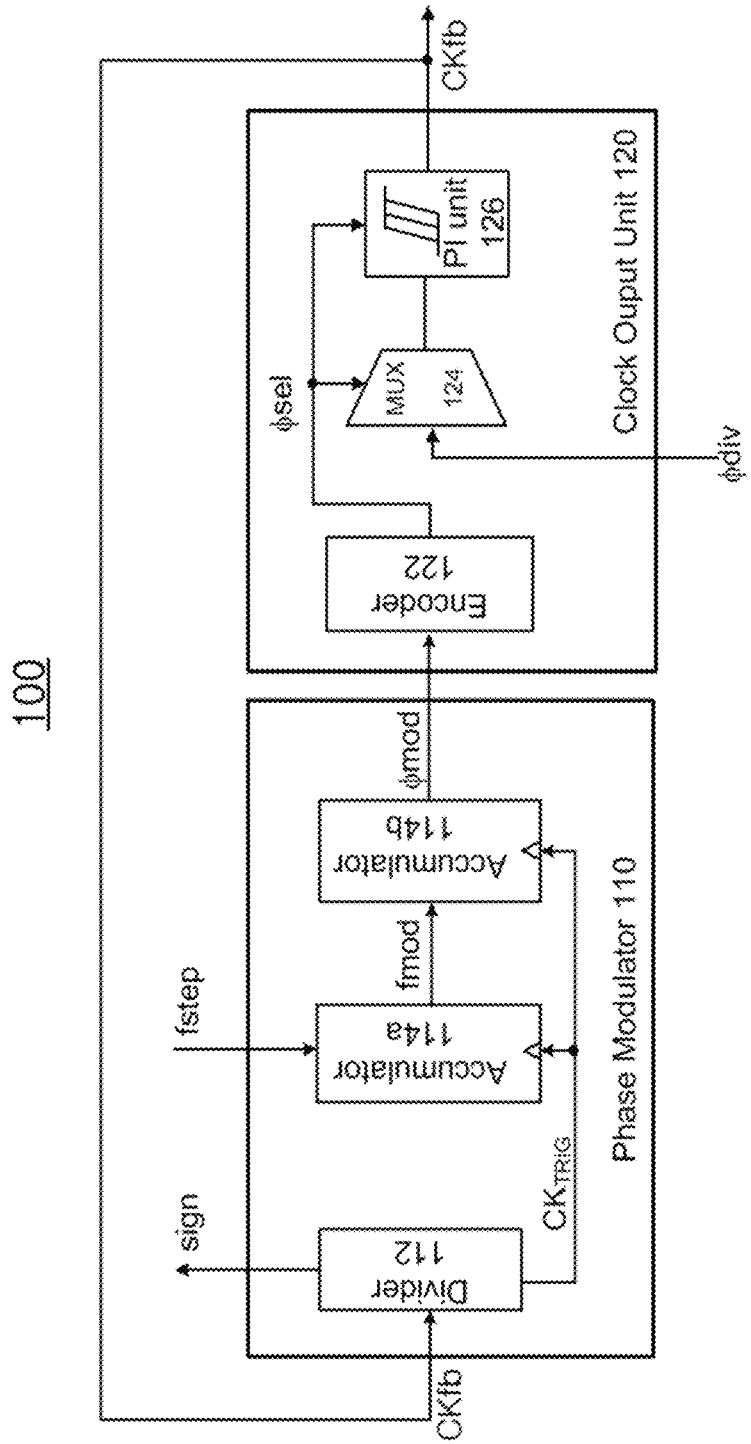
FIG. 4 is a block diagram illustrating an overview of a feedback clock generation unit 100.

FIG. 4 is a block diagram illustrating an output of the feedback clock generation unit 100. Referring to FIGS. 1, 2, and 4, the feedback clock generation unit 100 generates and provides sign signals (sign) and a phase-modulated feedback clock signal CKfb (S100). In some embodiments, the feedback clock generation unit 100 may include a phase modulator 110 which receives the feedback clock signal CKfb output by the feedback clock generation unit 100 and generates a phase modulated signal φmod having phase information of a signal to be output, and a clock output unit 120 which selects one preparatory clock signal corresponding to the phase information of the feedback clock signal CKfb to be output from the feedback clock generation unit 100 among a plurality of preparatory clock signals having different phases using the phase modulated signal φmod output from the phase modulator 110.

Figure 5A:
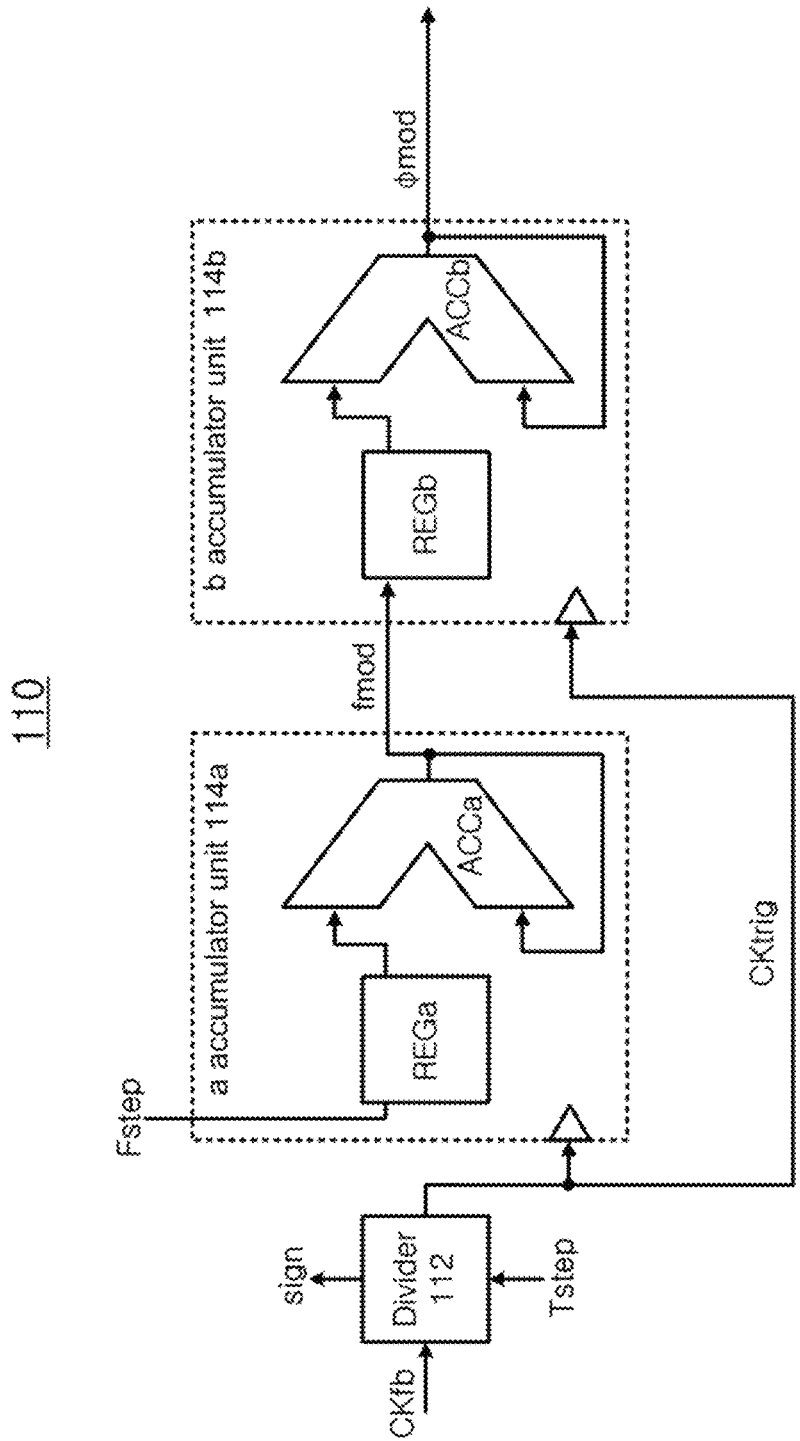
FIGS. 5A and 5B are block diagrams illustrating examples of an overview of a phase modulator 110.
Figure 5B:
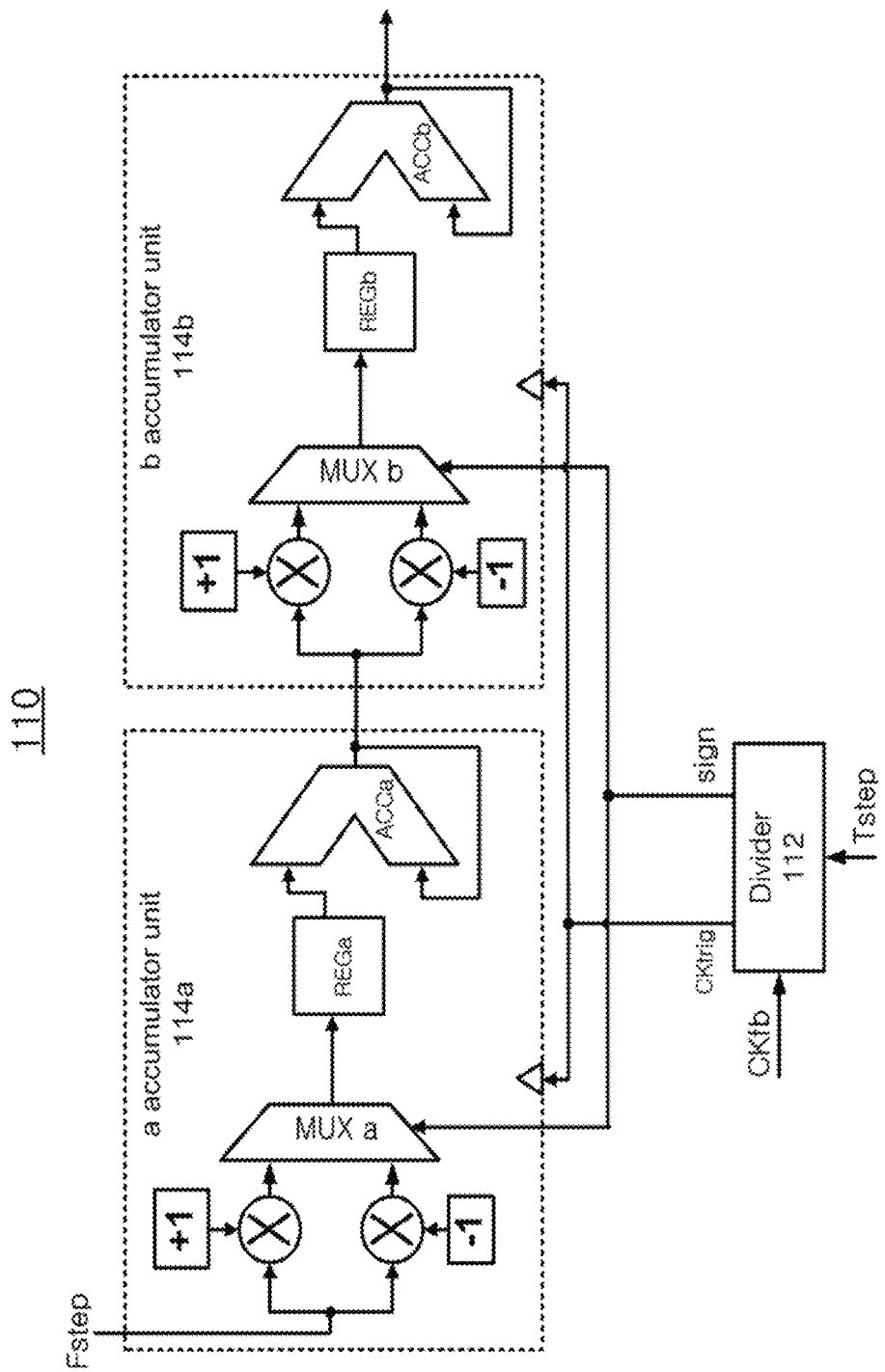

The phase modulator 110 may include a second frequency divider 112, an accumulator-A 114a, and an accumulator-B 114b. FIGS. 5A and 5B are block diagrams illustrating an overview of a phase modulator 110. Referring to FIGS. 4, 5A, and 5B, the second frequency divider 112 divides a feedback-input feedback clock signal CKfb at a predetermined frequency division ratio to generate sign signals (sign) and trigger clock signals CKtrig. The accumulator-A 114a and the accumulator-B 114b receive the trigger clock signals CKtrig generated by dividing the feedback clock signal CKfb and operates in synchronization therewith. The sign signals (sign) determine signs of values accumulated by performing accumulation, in order to generate a frequency control signal fcont. In addition, the second frequency divider 112 receives a time step signal Tstep determining a cycle of the trigger clock signals CKtrig, and accordingly adjusts the cycle of the trigger clock signals CKtrig by adjusting the frequency division ratio of the feedback clock signal CKfb.

Figure 6A:
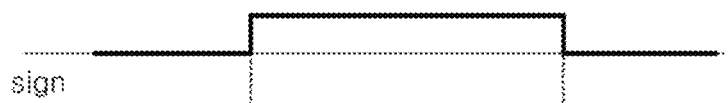
FIGS. 6A, 6B, and 6C are diagrams illustrating schematic shapes of a sign signal supplied by a second frequency divider, a signal supplied by a accumulator unit-A, and a signal supplied by an accumulator unit-B, respectively.
Figure 6B:
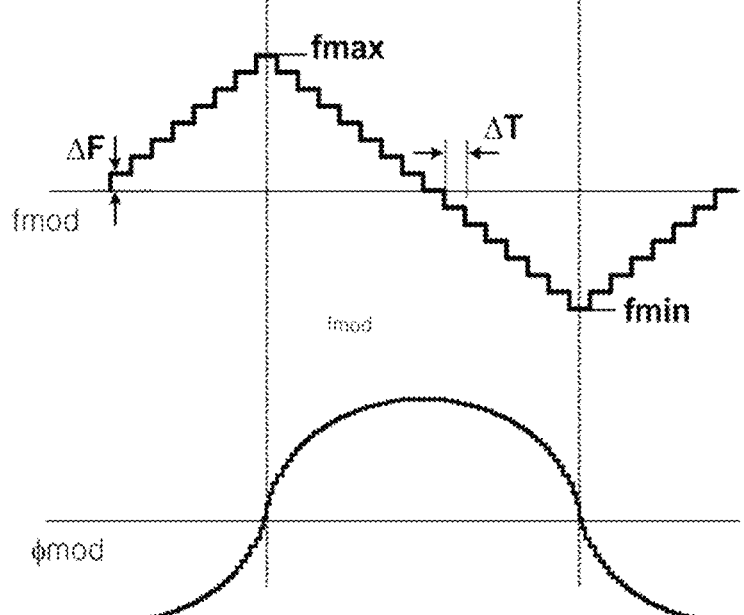
Figure 6C:
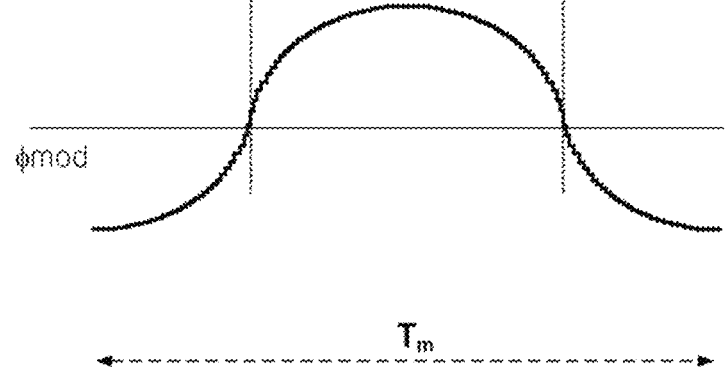

The accumulator-A 114a includes a register-A REGa which receives frequency step signals Fstep to be output in synchronization with the applied trigger clock signals CKtrig, and an accumulator-A ACCa which accumulates output signals supplied by the register-A REGa. FIGS. 6A, 6B, and 6C are diagrams illustrating overviews of a sign signal (sign) provided by the second frequency divider 112, a signal supplied by the accumulator-A 114a, and a signal provided by the accumulator-B 114b, respectively.

Referring to FIGS. 5A, 5B, and 6A to 6C, the frequency step signals Fstep corresponding to unit frequencies (ΔF) to be accumulated are supplied to an input to the register-A REGa. The register-A REGa supplies the frequency step signals Fstep to the accumulator-A ACCa in synchronization with the trigger clock signals CKtrig. The accumulator-A ACCa receives a signal output from the register-A REGa through one input thereof, and receives an output of the accumulator-A ACCa fed back thereto through the other input thereof. As the trigger clock signals CKtrig are input, the register-A REGa supplies the frequency step signals Fstep to the accumulator-A ACCa, and the accumulator-A ACCa accumulates the frequency step signals Fstep. Accordingly, a frequency modulated signal fmod output from the accumulator-A ACCa may be generated by additively accumulating or subtractively accumulating the unit frequencies ΔF for every cycle (ΔT) of the trigger clock signals CKtrig as illustrated in FIG. 6B. However, the frequency modulated signal fmod illustrated in FIG. 6B exaggerates that step waveforms that are superimposed to form a triangular waveform, in order to clearly emphasize that the unit frequencies ΔF are accumulated by the trigger clock signals CKtrig.

The frequency modulated signal fmod output from the accumulator-A ACCa is supplied to an input of a register-B REGb, and the register-B REGb outputs a signal input to the input thereof in synchronization with the trigger clock signals CKtrig. An accumulator-B ACCb receives the signal supplied by the register-B REGb through one input, and receives an output signal of the accumulator-B ACCb feedback thereto through the other input thereof. Accordingly, results calculated by the accumulator-A ACCa input to the input of the register-B REGb are additively accumulated or subtractively accumulated to the previously calculated result in synchronization with the trigger clock signals CKtrig. The signal output from the accumulator-B ACCb is obtained by re-accumulating the signals accumulated by the accumulator-A ACCa, that is, the phase modulated signal φmod obtained by integrating modulated frequencies. The phase modulated signal φmod has a quadratic parabolic shape as illustrated in FIG. 6C.

In FIGS. 6B and 6C, and the above-described embodiment, both of the register-A REGa and the register-B REGb are described as being operated in synchronization with the trigger clock signals CKtrig. However, this is only an example, and although not shown in the drawings, the accumulator-A 114a and the accumulator-B 114b may be operated in synchronization with a different clock signal from the externally applied trigger clock signals CKtrig. In other embodiments, the accumulator-A 114a and the accumulator-B 114b may generate a clock signal different from the externally applied trigger clock signals CKtrig and operate by being synchronized therewith.

As will be described below, the frequency slope tracker 400 accumulates the differences in error signals φerr to generate a frequency control signal (refer to fcont in FIG. 1) controlling a frequency of the DCO 500, a schematic shape of the frequency control signal fcont may be generated by tracking a schematic shape of the frequency modulated signal fmod. That is, the frequency slope tracker 400 generates the frequency control signal fcont such that a frequency change of the output signal CKout output by the DCO 500 corresponds to a frequency change of the frequency modulated signal fmod, and controls the DCO 500. In addition, the phase modulated signal φmod, as will be described below, has information on the phase of the feedback clock signal CKfb provided by the feedback clock generation unit 100. By using the information, a preparatory clock with a target phase is selected among a plurality of preparatory clocks with various phases.

Referring to an embodiment illustrated in FIG. 5A, the accumulator-A ACCa may be a bidirectional accumulator, which operates in synchronization with the trigger clock signals CKtrig to perform accumulation by reversing signs input to the input thereof when a predetermined number of trigger clock signals CKtrig are input. For example, the frequency information signal illustrated in FIG. 6B may be formed in such a manner that the frequency step signals Fstep are additively accumulated with the + sign until a $1024^{th}$ trigger clock signal CKtrig, and subtractively accumulated from the accumulated result by reversing signs of the frequency step signals Fstep input to the one input of the accumulator-A ACCa until the next $1024^{th}$ trigger clock signal CKtrig. Therefore, according to the embodiment of the present invention, the sign signals (sign) may not be required when an additive or subtractive accumulation is performed in the feedback clock generation unit 100. The accumulator-B ACCb is a unidirectional accumulator.

Referring to an embodiment illustrated in FIG. 5B, the accumulator-A ACCa is a unidirectional accumulator, and the signs of the frequency step signals Fstep to be accumulated are determined by the sign signals (sign) input to a multiplexer-A MUXa. For example, as illustrated in FIG. 6A, when the sign signals (sign) is at a low level, the multiplexer-A MUXa selects frequency step signals Fstep with positive signs and outputs them to the register-A REGa, and the accumulator-A ACCa accumulates them to generate a frequency modulated signal fmod. However, when the sign signals (sign) are at a high level, the multiplexer-A MUXa selects frequency step signals Fstep with negative signs and outputs them to the register-A REGa, and the accumulator-A ACCa accumulates them to generate a frequency modulated signal fmod. The accumulated signals have negative signs, and the accumulator-A ACCa performs a subtractive accumulation. The accumulator-B ACCb is a unidirectional accumulator.

Referring again to FIG. 4, the phase modulated signal φmod having the phase information of the feedback clock signal CKfb to be output by the feedback clock generation unit 100 is supplied to the clock output unit 120. The clock output unit 120 includes an encoder 122, a multiplexer (MUX) 124, and a phase interpolation unit 126. The encoder 122 obtains the phase information of the feedback clock signal CKfb to be output from the feedback clock generation unit 100 from the phase modulated signal φmod, generates a select signal φsel configured to select a preparatory clock signal with a phase corresponding to the phase information among the plurality of preparatory clock signals with various phases, and provides it to the MUX 124 and the phase interpolation (PI) unit 126.

The MUX 124 selects two signals among the plurality of signals φdiv output from the phase shift unit 700 (refer to FIG. 1) and having different phases, using the select signal φsel. The PI unit 126 generates the plurality of preparatory clock signals having phases obtained by interpolating phase differences between the two signals output from the MUX, selects a preparatory clock signal having a target phase among the plurality of preparatory clock signals, and outputs the selected signal. In some embodiments, the MUX 124 selects two signals among the plurality of signals φdiv having different phases output from the phase shift unit 700 (refer to 700 in FIG. 1), as illustrated in FIG. 3B, according to the select signal φsel and provides the two signals to the PI unit 126.

Figure 7:
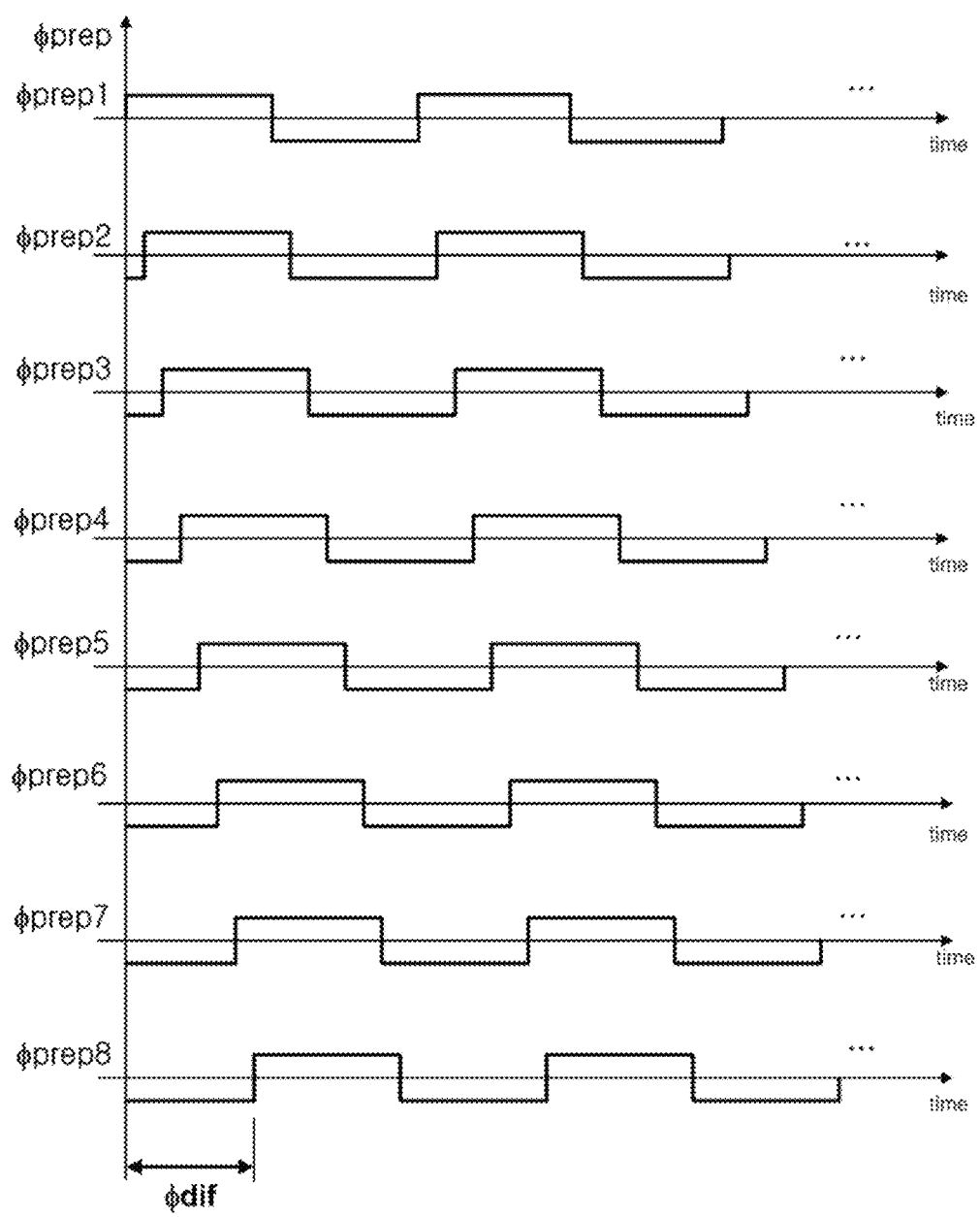
FIG. 7 illustrates two signals selected and output by a multiplexer according to a select signal Φsel, and a plurality of preparatory clock signals having phases obtained by interpolating phase differences between two signals.

FIG. 7 illustrates two signals which the MUX selects and outputs according to the select signal φsel, and a plurality of preparatory clock signals having the phases obtained by interpolating the phase differences between the two signals. Referring to FIG. 7, for example, when the signal selected by the MUX 124 and provided to the PI unit 126 are φprep1 and φprep8, the PI unit 126 interpolates phase differences φdif to generate the preparatory clock signals φprep2 to φprep7 having different phases. As another example, when two signals having mutually adjacent phases such as φdiv1 and φdiv2, and φdiv2 and φdiv3 in FIGS. 3A and 3B are selected, preparatory clock signals having higher levels of phase resolution may be obtained through interpolation. As illustrated in FIG. 7, the phase differences may be linearly interpolated. Although not shown in the drawings, it is obvious that the phase differences can be non-linearly interpolated.

For example, the first frequency divider (Div) 600 may output the divided clock signals CKdiv (refer to FIG. 1) as 8 signals having a plurality of phases, and the MUX 124 may selects two signals having mutually adjacent phases among the 8 signals and generates 128 preparatory clock signals. In some embodiments, the MUX 124 may generate 1024 preparatory clock signals. Phases of the generated preparatory clock signals may be determined according to a linear function or a non-linear function. In some embodiments, as illustrated in FIG. 7, the phases of the preparatory clock signal signals may be determined according to a predetermined linear function, and accordingly, the phase differences of the preparatory clock signals may be constant. In other embodiments, although not shown in the drawings, the phases of the preparatory clock signal signals may be determined according to a predetermined non-linear function, and accordingly, the phase differences of the preparatory clock signals may be different from each other.

The encoder 122 generates a select signal φsel so as to select a preparatory clock signal corresponding to the feedback clock signal CKfb to be output, and supplies the select signal φsel to the MUX 124 and the PI unit 126. The PI unit 126 generates a plurality of preparatory clock signals, selects a preparatory clock signal having a target phase, and outputs the selected preparatory clock signal as the feedback clock signal CKfb.

Referring again to FIGS. 1 and 2, the TDC 200 detects frequency and phase differences between the feedback clock signal CKfb and the reference clock signal CKref, and outputs error signals (pen corresponding thereto (S200). For example, the error signals φerr includes an up-signal which increases the frequency and phase of the output signal CKout output from the DCO 500 in the case that the feedback clock signal CKfb has a lower frequency and phase than the reference clock signal CKref, and a down-signal which decreases the frequency and phase of the output signal CKout in the opposite case thereof. When the embodiment of the present invention is implemented in an analog circuit, the TDC 200 may be implemented as a phase frequency detector (PFD) through which the phase or frequency differences between two signals are output in terms of a voltage or current corresponding thereto. Hereinafter, both the TDC and PFD are collectively referred to as the TDC 200.

The digital loop filter 300 receives the error signals (pen, performs signal processing, such as passing low frequencies including signal components required for controlling the DCO 500 and blocking unnecessary high frequencies, and supplies a signal to control the DCO 500. When the digital loop filter 300 according to the embodiment of the present invention is implemented in an analog filter, the digital loop filter 300 may be implemented, for example, as a low pass filter including a branch in which a resistor and a capacitor are connected in series. The resistor included in the branch performs phase compensation, and the capacitor included in the branch performs frequency compensation. Accordingly, the PLL is locked to a predetermined phase and frequency by the resistor and the capacitor. The analog loop filter may further include a capacitor connected in parallel with the branch in which the resistor and the capacitor are connected in series.

When implemented in a digital filter, the digital loop filter 300 may be a digital low-pass filter. The digital loop filter 300 generates a control signal controlling the DCO 500 to be supplied. The control signal generates a proportional gain signal $\alpha$ which is a phase-compensating digital code, and an integral gain signal $\beta$ which is a frequency-compensating digital code, and supplies them to the DCO 500.

Figure 8:
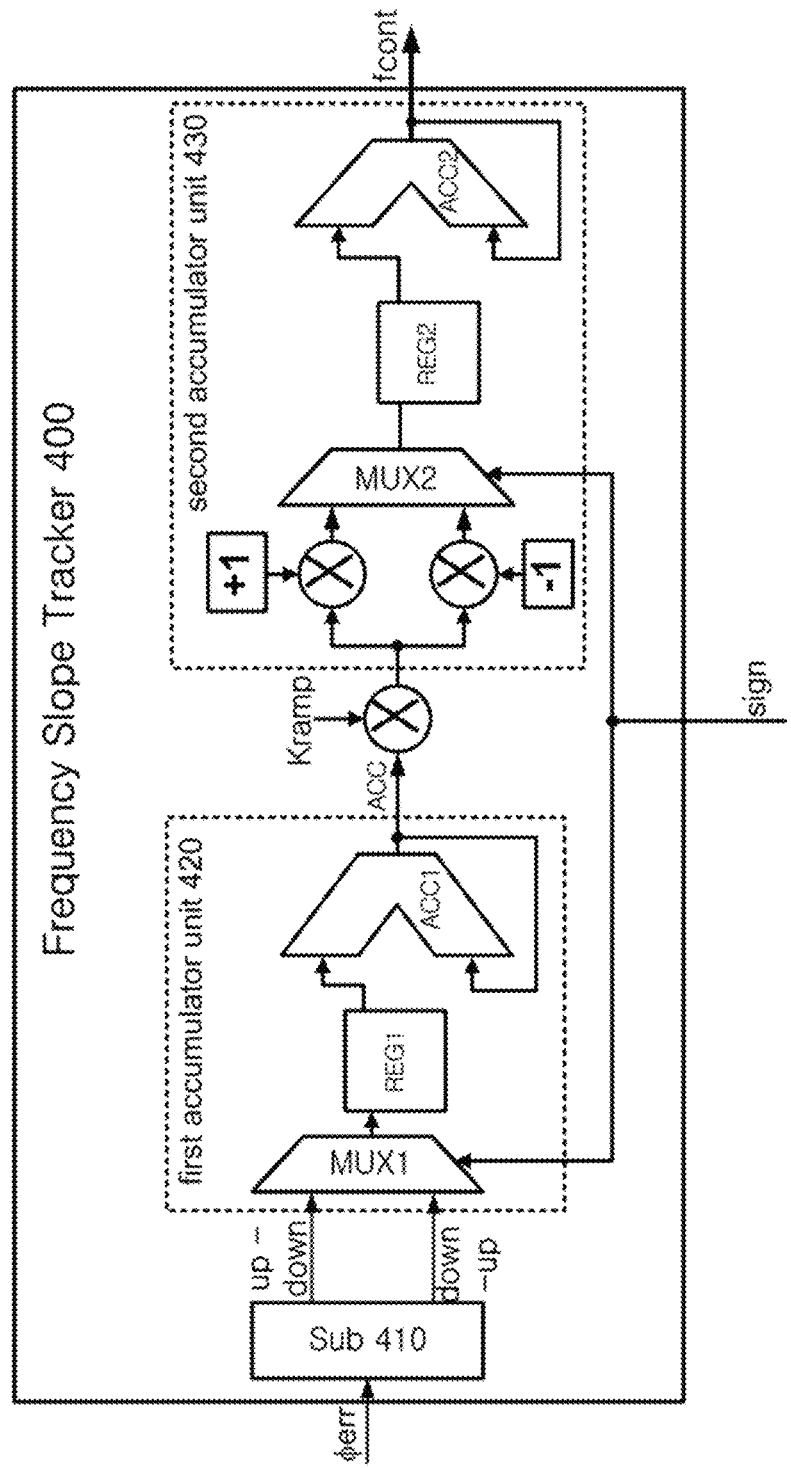
FIG. 8 is a block diagram schematically illustrating a configuration of a frequency slope tracker.

The frequency slope tracker 400 receives the error signals $\phi$err and the sign signals (sign), accumulates differences of error signals $\phi$err according to signs corresponding to the sign signals (sign), and generates the frequency control signal fcont (S300). FIG. 8 is a block diagram schematically illustrating a configuration of a frequency slope tracker 400. Referring to FIG. 8, the frequency slope tracker 400 includes a subtractor (Sub) 410 which calculates and supplies the differences of the error signals (pen, a first accumulator unit 420 which receives the sign signals (sign) and accumulates and supplies the differences of the error signals (pen corresponding thereto, a second accumulator unit 430 which receives the sign signals (sign) and outputs a frequency control signal fcont generated by accumulating the signals output from the first accumulator unit 420 according to a sign of the sign signals (sign), and a gain multiplier 440.

The first accumulator unit 420 includes a first multiplexer MUX1 which determines and outputs signs of the differences of the error signals $\phi$err according to the sign signals (sign), a first register REG1 receiving the differences of the error signals $\phi$err having the determined signs, and a first accumulator ACC1 accumulating output signals from the first register REG1.

The second accumulator unit 430 includes a second multiplexer MUX2 which determines and outputs signs of the signals output from the first accumulator ACC1 according to the sign signals (sign), a second register REG2 which receives signals having the determined signs, and a second accumulator ACC2 which accumulates the output signals from the second register REG2 and generates a frequency control signal fcont to be output.

The differences of the error signals $\phi$err including the up-signals and the down-signals are calculated at the subtractor (Sub) 410. The subtractor (Sub) 410 supplies an up-down signal corresponding to a result obtained by subtracting a down-signal from an up-signal, and a down-up signal corresponding to a result obtained by subtracting an up-signal from a down-signal. The first multiplexer MUX1 selects one signal according to the sign signals (sign) and supplies the selected signal to the first register REG1. The first register REG1 supplies the signal supplied from the first multiplexer MUX1 to one input of the first accumulator ACC1.

As illustrated in FIG. 8, the output signals from first accumulator ACC1 are fed back to the other input of the first accumulator ACC1. Accordingly, the first accumulator ACC1 accumulates the input signals. The accumulated result is multiplied by a ramp gain Kramp at the gain multiplier 440. FIG. 8 only illustrates an embodiment in which the gain multiplier 440 is disposed between an output of the first accumulator unit 420 and an input of the second accumulator unit 430. However, in other embodiments not illustrated in the drawings, the gain multiplier 440 may be disposed between an output of the first multiplexer MUX1 and an input of the second accumulator unit 430, or connected to an output of the second accumulator ACC2. The second multiplexer MUX2 accumulates the output signals of the first accumulator ACC1, multiplied by the ramp gain Kramp, as the signs corresponding to sign signals (sign) to generate and supply a frequency control signal fcont.

In some embodiments, the frequency slope tracker 400 may operate in synchronization with a feedback clock signal CKfb. In other embodiments, the frequency slope tracker 400 may further include a third frequency divider dividing the feedback clock signal CKfb. In this case, the frequency slope tracker 400 may operate in synchronization with clock signals generated by dividing the feedback clock signal CKfb by the third frequency divider.

Operations of the frequency slope tracker 400 having such a configuration will be described in detail. In this embodiment, the reference clock signal CKref is assumed to have a constant frequency and phase. The phase of the feedback clock signal CKfb supplied by the feedback clock generation unit 100 varies according to the phase modulated signal $\phi$mod illustrated in FIG. 6C. In a general digital PLL, a phase and a frequency are fixed by controlling a DCO using a control signal generated by filtering error signals using a digital loop filter. In addition, the digital loop filter included in the digital PLL filters the error signals output from a TDC to generate a proportional gain signal and an integral gain signal. As described above, the phase is fixed by controlling the proportional gain signal, and the frequency is fixed by controlling the integral gain signal.

However, the PLL according to the embodiment of the inventive concept is not for fixing the phase or frequency, but for synthesizing a signal having a frequency varying within a certain frequency band, and thus the function thereof is different from the function of the general digital PLL.

FIGS. 9A to 9D are diagrams illustrating a sign signal (sign), an ACC1 output signal ACC, a frequency control signal fcont, and a DCO output signal CKout, in a phase-locked state. An exemplary operation will be described with reference to FIGS. 9A to 9D. When the frequency or phase of the feedback clock signal CKfb is relatively lagging behind the reference clock signal CKref, the TDC 200 generates and outputs an up-signal greater than a down-signal. The sign signals (sign) are supplied to the first multiplexer MUX1 so that the first multiplexer MUX1 selects an up-down signal obtained by subtracting the down-signal from the up-signal, as a time slot marked ① in FIG. 9A, and the first multiplexer MUX1 supplies the selected signal to the first accumulator ACC1.

The first accumulator ACC1 accumulates the up-down signals obtained by subtracting the down-signals from the up-signals, and the accumulated result is multiplied by a predetermined ramp gain Kramp. The second multiplexer MUX2 is controlled to select + signs by the sign signals (sign), and the selected signs are additively accumulated by the second accumulator ACC2.

On the other hand, when the frequency or phase of the feedback clock signal CKfb is relatively leading the reference clock signal CKref, the TDC 200 generates and output a down-signal greater than an up-signal. The sign signals (sign) are supplied to the first multiplexer MUX1 so that the first multiplexer MUX1 selects a down-up signal obtained by subtracting the up-signal from the down-signal, as a time slot marked ② in FIG. 9A, and the first multiplexer MUX1 supplies the selected signal to the first accumulator ACC1.

The first accumulator ACC1 accumulates the down-up signals obtained by subtracting the up-signals from the down-signals, and the accumulated result is multiplied by a predetermined ramp gain Kramp. The second multiplexer MUX2 is controlled to select − signals by the sign signals (sign), and the selected value is subtractively accumulated by the second accumulator ACC2.

When the embodiment of the present invention is configured with an analog circuit, the TDC 200 outputs a signal in which the up-signal is a main signal when the frequency or phase of the feedback clock signal CKfb is relatively lagging behind the reference clock signal CKref. On the other hand, the TDC 200 outputs a signal in which the down-signal is a main signal when the frequency or phase of the feedback clock signal CKfb is relatively leading the reference clock signal CKref. For example, the signal in which the up-signal is a main signal may represent a signal in which a pulse width of the up-signal is greater than a pulse width of the down-signal, and the signal in which the down-signal is a main signal may represent a signal in which a pulse width of the down-signal is greater than a pulse width of the up-signal.

When the embodiment of the present invention is configured with a digital circuit, the up-signals and the down-signals may respectively output digital codes representing a certain value. For example, when the frequency or phase of the feedback clock signal CKfb is relatively lagging behind the reference clock signal CKref, the TDC 200 may output up-signals at 1-bit high levels, and down-signals at 1-bit low levels. In other embodiments, the up-signals and the down-signals may be respectively output as multi-bit signals.

In the embodiments of the present invention, not only the proportional gain signal and the integral gain signal supplied by the digital loop filter 300 but also the frequency control signal fcont supplied by the frequency slope tracker 400 may be used to synthesize a variable frequency signal. However, differences between the up-signals and the down-signals (or a difference between the down-signal and the up-signal) are smaller than the proportional gain signal and the integral gain signal which are used to fix the frequency and phase. Accordingly, the first accumulator ACC1 generates a signal ACC having a smaller difference than the proportional gain signal and the integral gain signal. That is, fluctuations in the signal ACC generated by accumulating the differences between the up-signals and the down-signals (or the differences between the down-signals and the up-signals) may be smaller than fluctuations in the proportional gain signal or the integral gain signal.

Figure 9:
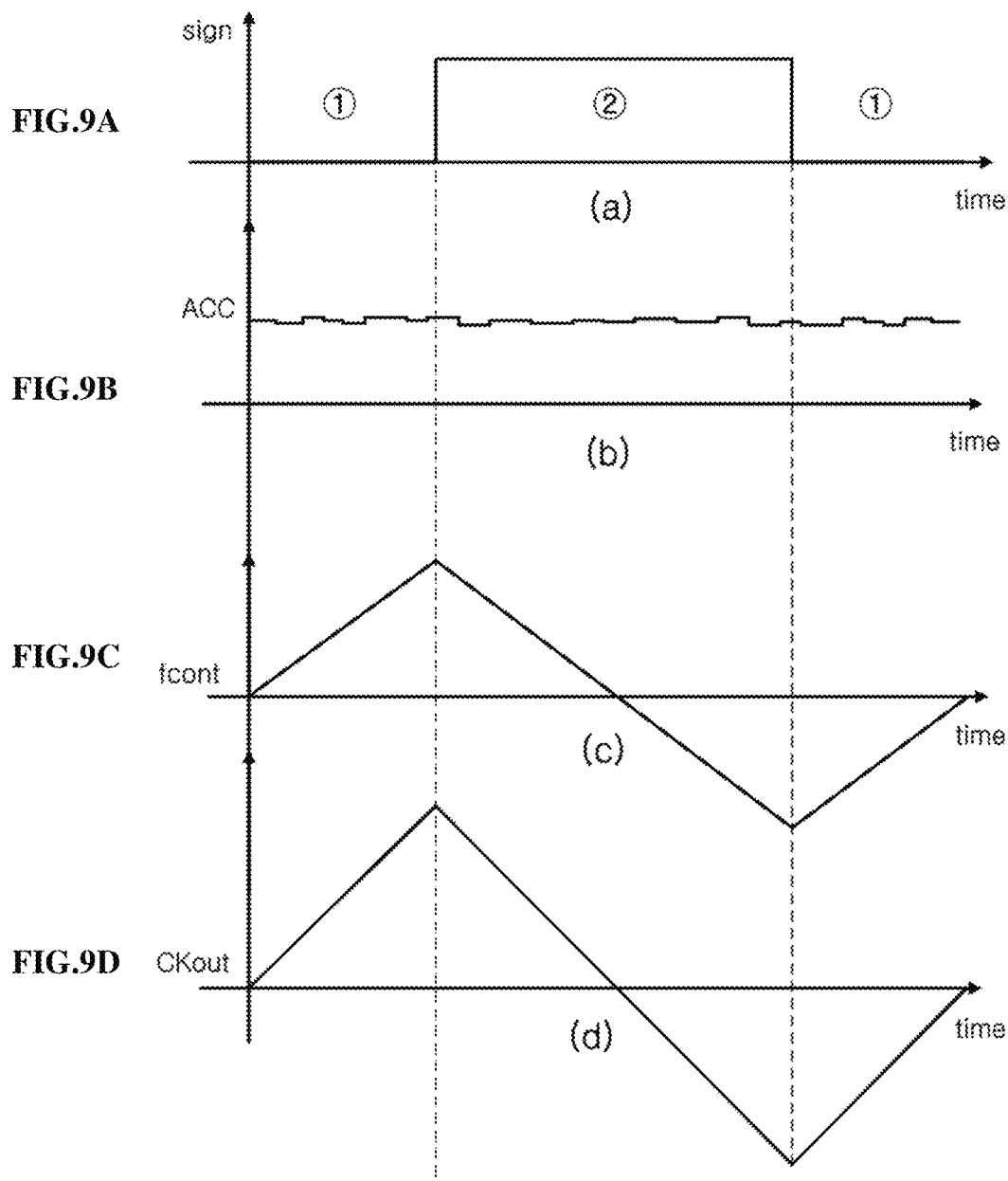
FIGS. 9A to 9D are diagrams illustrating a sign signal, an output signal of a first accumulator, a frequency control signal, and an output signal of a digitally controlled oscillator.

FIG. 9B illustrates the result obtained by accumulating differences between up-signals and down-signals by a first accumulator unit (reference numeral 420 in FIG. 8). As described above, since the differences between the up-signals and the down-signals are not significant, a difference between the maximum value and the minimum value in a signal generated by accumulating differences between the two signals is also negligible.

A frequency control signal fcont generated by the signal being re-accumulated according to the sign corresponding to the sign signal (sign) has a triangular waveform, and has a step difference corresponding to the difference between the up-signal and the down-signal. In FIG. 9C, which illustrates the frequency control signal fcont, it is schematically shown that the frequency control signal fcont has the triangular waveform in the accumulated result, and illustration of the influence by the step difference is omitted in order to clearly illustrate the shape of the frequency control signal fcont.

By calculating the differences between the up-signals and the down-signals corresponding to the sign signal (sign), and additively accumulating or subtractively accumulating the differences according to signs corresponding to the sign signals (sign), the frequency control signal fcont may be generated to control the frequency of the DCO output signal CKout to increase or decrease, as illustrated in FIG. 9C. The frequency control signal fcont generated in such a manner is supposed to track the overview of the frequency modulated signal illustrated in FIG. 6B, and the frequency slope tracker 400 supplies the frequency control signal fcont generated in such a manner to the DCO 500.

FIG. 9D is a diagram illustrating an overview of a signal CKout output from the DCO 500 controlled by signals supplied by the digital loop filter 300 and a frequency control signal fcont supplied by the frequency slope tracker 400. As illustrated in FIG. 9D, the frequency of the signal CKout varies according to the frequency control signal fcont supplied to the digitally controlled oscillator 500.

Implemental Embodiment

Figure 10:
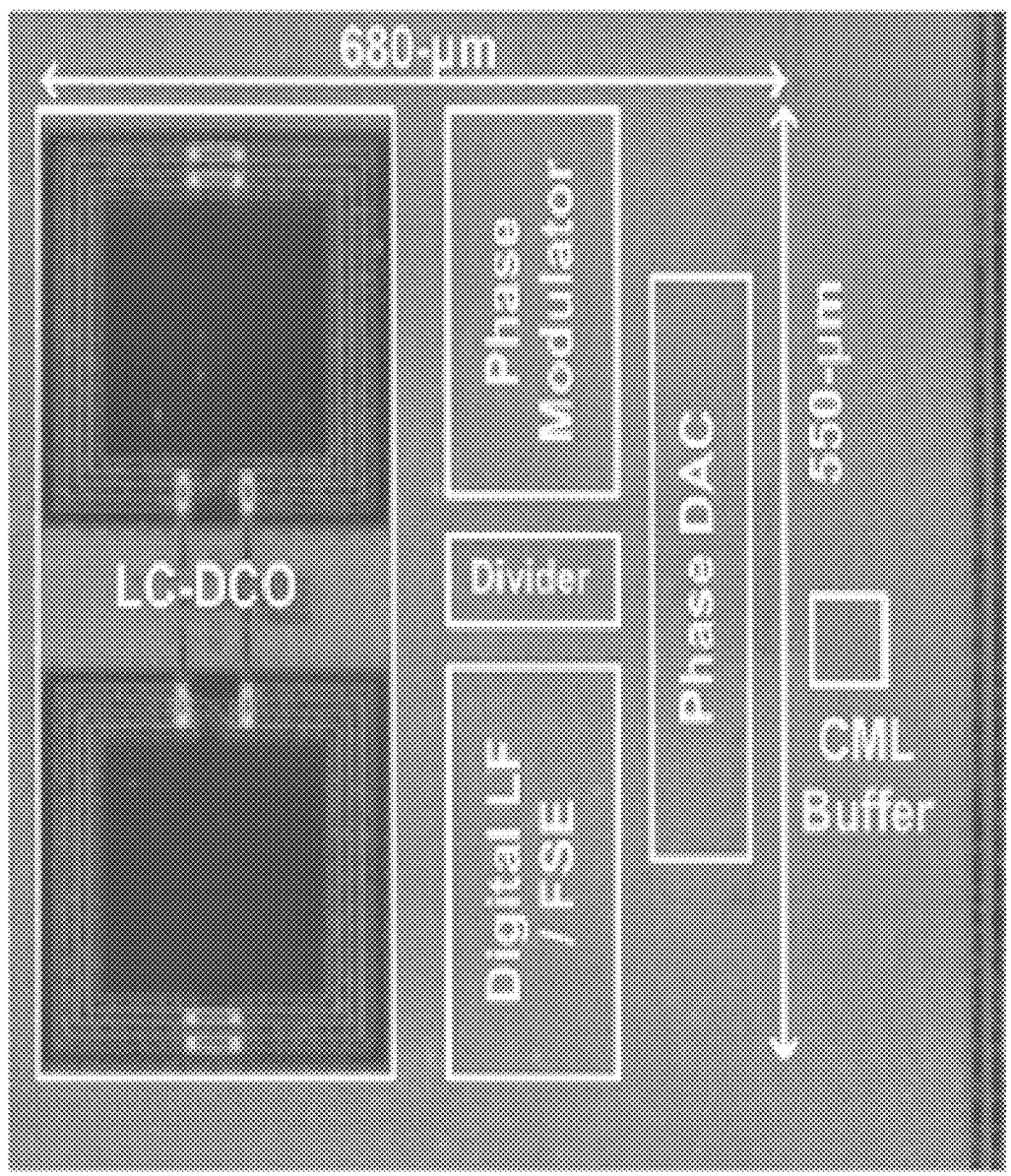
FIG. 10 is a microscopic photograph of an embodiment of the present invention.

An embodiment of the present invention was implemented through a UMC 65 nm LP CMOS process by the inventors of the present invention. A microscopic photograph of the embodiment is illustrated in FIG. 10, and measured performances are listed in the following Table 1.

TABLE 1

| Process | Supply Voltage | Input Frequency | Output Frequency | Frequency Bandwidth |
|---|---|---|---|---|
| 65 nm 1P8M CMOS LP | 1.2 V | 143.75 MHz | 8.96~9.58 GHz | Max. 600 MHz |

| Modulation Cycle | RMS Frequency Error | Phase Noise | Power Consumption | Active Area |
|---|---|---|---|---|
| 15 to 200 μsec | <1 MHz (including corners) | −97 dBc/Hz @1 MHz offset<br>−120 dBc/Hz @10 MHz offset | 63.9 mW | 0.374 mm$^2$ |

Triangular frequency modulation was performed within the range of 8.96 to 9.58 GHz using an external reference clock of 143.75 MHz. A modulation of modulation 15 µsec and a maximum modulation bandwidth of 480 MHz were implemented with no frequency distortion.

FIG. 11 illustrates time versus frequency characteristics comparing the case in that a frequency slope tracker operates with the case in that a frequency slope tracker does not operate, under a condition in which the cycle of modulation is 15 µsec. An accurate frequency profile in which a preferred wide range of frequency is rapidly modulated was obtained even at a turn-around point when the frequency slope tracker is enabled. On the other hand, the accurate frequency profile was not obtained when the preferred the frequency slope tracker is disabled.

In a conventional 2-point modulation method, errors, such as gain mismatch or timing mismatch may occur while modulated signals supplied to two different points are independently generated and supplied. However, according to the embodiment of the present invention, since the modulated signals supplied by a frequency modulated signal generation unit are error signals ϕerr and sign signals (sign) output from the TDC 200, the timing mismatch does not occur even at the corners at which the slope of a frequency variation graph is switched from positive to negative or vice versa.

In addition, in a conventional technology for forming frequency modulated signals, when bandwidths or the number of filterings of a PLL are not sufficient, the frequency profile was not clearly switched at the corners at which a frequency-increasing section and a frequency-decreasing section meet. However, according to the embodiment of the present invention, since an additive accumulation and a subtractive accumulation are performed using sign signals (sign), a boundary at which the frequency profile is switched may be clear and an output frequencies of a DCO may be clearly switched even at the corner.

According to the embodiment of the present invention, a variable frequency signal synthesizer having a short cycle and a large frequency variation, and a method of synthesizing a variable frequency signal may be provided.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A variable frequency signal synthesizer, comprising:
a phase locked loop including a time-to-digital converter configured to detect differences in phase and frequency between a reference clock signal and a feedback clock signal and output error signals corresponding to the detected differences, a digital loop filter, a digitally controlled oscillator, and a first frequency divider configured to divide output signals of the digitally controlled oscillator at a predetermined frequency division ratio;
a feedback clock generation unit configured to generate sign signals and a phase-modulated feedback clock signal; and
a frequency slope tracker configured to generate a frequency control signal by accumulating differences in the error signals according to signs corresponding to the sign signals,
wherein the digitally controlled oscillator receives the frequency control signal to supply an output variable frequency signal.

2. The variable frequency signal synthesizer of claim 1, further comprising a phase shift unit configured to receive signals output from the first frequency divider, generate a plurality of signals having different phases, and provide the plurality of signals to the feedback clock generation unit.

3. The variable frequency signal synthesizer of claim 2, wherein the feedback clock generation unit comprises:
a phase modulator configured to receive the feedback clock signal output from the feedback clock generation unit and generate phase-modulated signals having phase information of the feedback clock signal to be output; and
a clock output unit configured to select and output the feedback clock signal having a target phase among a plurality of preparatory clock signals.

4. The variable frequency signal synthesizer of claim 3, wherein the phase modulator comprises:
a second frequency divider configured to generate sign signals by receiving the feedback clock signal and dividing the feedback clock signal at a predetermined frequency division ratio;
a first accumulator unit configured to supply frequency modulated signals by receiving and accumulating frequency step signals; and
a second accumulator unit configured to output a phase modulated signal by receiving and accumulating the frequency modulated signals.

5. The variable frequency signal synthesizer of claim 4, wherein the first accumulator unit includes a first register configured to receive the frequency step signals and a first bidirectional accumulator configured to accumulate outputs of the first register and output the frequency modulated signals, and
the second accumulator unit includes a second register configured to receive the frequency modulated signals and a second unidirectional accumulator configured to accumulate outputs of the second register and output the phase modulated signal.

6. The variable frequency signal synthesizer of claim 4, wherein the first accumulator unit includes a first multiplexer configured to determine and output signs of the received frequency step signals, a first register configured to receive the frequency step signals having the determined signs, and a first accumulator configured to accumulate outputs of the first register and output the frequency modulated signals, and
the second accumulator unit includes a second register configured to receive the frequency modulated signals and a second accumulator configured to accumulate outputs of the second register and output the phase modulated signal.

7. The variable frequency signal synthesizer of claim 4, wherein the second frequency divider further generates trigger clock signals by dividing the feedback clock signal at a predetermined frequency division ratio, and
the first accumulator unit and the second accumulator unit operate in synchronization with the trigger clock signals.

8. The variable frequency signal synthesizer of claim 7, wherein the second frequency divider further receives time step signals having cycle information of the trigger clock signals, to control a cycle of the trigger clock signals so as to correspond to the cycle information.

9. The variable frequency signal synthesizer of claim 3, wherein the clock output unit comprises:
a multiplexer configured to select and output two signals among the signals supplied by the phase shift unit;

a phase interpolation unit configured to supply the plurality of preparatory clock signals obtained by interpolating phase differences between the two signals output from the multiplexer; and an encoder configured to generate a select signal corresponding to a phase modulated signal, wherein the multiplexer selects and outputs the two signals using the select signal, and the phase interpolator selects one preparatory clock signal among the plurality of preparatory clock signals using the select signal, and outputs the selected preparatory clock signal as the feedback clock signal.

10. The variable frequency signal synthesizer of claim 9, wherein the multiplexer receives the signals supplied by the phase shift unit, to select and output two signals.

11. The variable frequency signal synthesizer of claim 1, wherein the frequency slope tracker comprises:
   a subtractor configured to calculate and output the differences in error signals;
   a first accumulator unit configured to receive the sign signals and accumulate and output the differences in error signals according to signs corresponding to the sign signals; and
   a second accumulator unit configured to receive the sign signals and output the frequency control signal obtained by accumulating the differences in error signals accumulated by the first accumulator unit.

12. The variable frequency signal synthesizer of claim 11, wherein the frequency slope tracker further includes a gain multiplier.

13. The variable frequency signal synthesizer of claim 11, wherein the first accumulator unit includes a first multiplexer configured to determine and output the signs of the input differences in error signals according to the sign signals, a first register configured to receive the differences in error signals having the determined signs, and a first accumulator configured to accumulate the output of the first register to be output, and
   the second accumulator unit includes a second multiplexer configured to determine and output signs of signals output from the first accumulator according to the sign signals, a second register configured to receive the signals having the determined signs, and a second accumulator configured to generate and output the frequency control signal obtained by accumulating signals output from the second register.

14. The variable frequency signal synthesizer of claim 12, wherein the gain multiplier is disposed at an input of the first accumulator unit, between an output of the first accumulator unit and an input of the second accumulator unit, or at an output of the second accumulator.

15. The variable frequency signal synthesizer of claim 1, wherein frequency control signal is input to the digitally controlled oscillator along with the error signals.

16. A method of synthesizing a variable frequency signal, comprising:
   (a) outputting sign signals and one clock signal having a target phase among a plurality of clock signals having different phases as a feedback clock signal by performing phase modulation;
   (b) outputting error signals corresponding to differences in frequency and phase between the feedback clock signal and a reference signal;
   (c) generating a frequency control signal by accumulating the differences in error signals according to signs corresponding to the sign signals; and
   (d) outputting a variable frequency signal by supplying the frequency control signal to a digitally controlled oscillator.

17. The method of claim 16, wherein the process (a) comprises:
   (a1) generating a phase modulated signal having phase information of the feedback clock signal to be output by performing phase modulation; and
   (a2) selecting and outputting the feedback clock signal having a phase corresponding to the phase modulated signal among a plurality of preparatory clock signals.

18. The method of claim 17, wherein the process (a1) comprises:
   (a11) receiving the feedback clock signal and dividing it at a predetermined frequency division ratio;
   (a12) receiving and accumulating frequency step signals; and
   (a13) generating the phase modulated signal by receiving and accumulating the accumulated signals.

19. The method of claim 18, wherein the process (a11) further includes generating a trigger clock signal by receiving the feedback clock signal and dividing it at a predetermined frequency division ratio, and
   the processes (a12) and (a13) are performed in synchronization with the trigger clock signals.

20. The method of claim 19, wherein the process (a1) is performed by further receiving a time step signal having cycle information of the trigger clock signal and controlling a cycle of the trigger clock signals by controlling the frequency division ratio so as to correspond to the cycle information.

21. The method of claim 17, wherein the process (a2) comprises:
   (a21) generating a select signal selecting the feedback clock signal having the phase corresponding to the phase modulated signal by encoding the phase modulated signal;
   (a22) selecting two clock signals among the plurality of clock signals having different phases by the select signal; and
   (a23) generating the plurality of preparatory clock signals having different phases by interpolating phase differences between the two clock signals, and outputting the selected preparatory clock signal selected by the select signal as the feedback clock signal.

22. The method of claim 16, wherein the process (c) comprises:
   (c1) calculating the differences in error signals; and
   (c2) receiving the sign signal and accumulating the differences in error signals according to signs corresponding to the sign signals; and
   (c3) receiving the sign signals and accumulating the accumulated differences in error signals according to signs corresponding to the sign signals.

23. The method of claim 22, wherein the process (c) further includes multiplying the accumulated result obtained by the process (c3) by a ramp gain value.

* * * * *